US 7,670,691 B2

United States Patent
Byun et al.

(10) Patent No.: US 7,670,691 B2
(45) Date of Patent: Mar. 2, 2010

(54) CYCLOMETALATED TRANSITION METAL COMPLEX AND ORGANIC ELECTROLUMINESCENT DISPLAY DEVICE USING THE SAME

(75) Inventors: Young-Hun Byun, Yongin-si (KR); Yi-Yeol Lyu, Yongin-si (KR); Yu-Jin Kim, Suwon-si (KR); Das Rupasree Ragini, Suwon-si (KR); Seok Chang, Daejeon-si (KR); Lyong Sun Pu, Suwon-si (KR); In-Nam Kang, Ansan-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1141 days.

(21) Appl. No.: 11/220,866

(22) Filed: Sep. 8, 2005

(65) Prior Publication Data

US 2006/0099446 A1 May 11, 2006

(30) Foreign Application Priority Data

Nov. 6, 2004 (KR) .................. 10-2004-0090127

(51) Int. Cl.
*H01L 51/54* (2006.01)
*C09K 11/06* (2006.01)
(52) U.S. Cl. .............. 428/690; 428/917; 313/504; 313/506; 257/40; 257/E51.044; 546/4; 546/10; 548/101; 548/103; 556/13; 556/14; 556/20
(58) Field of Classification Search ............ 428/690, 428/917; 313/504, 506; 257/40, E51.044; 546/4, 10; 548/101, 103; 556/13, 14, 20
See application file for complete search history.

(56) References Cited

U.S. PATENT DOCUMENTS

| 5,920,080 A * | 7/1999 | Jones .................. 257/40 |
| 2002/0048689 A1 * | 4/2002 | Igarashi et al. ......... 428/690 |
| 2002/0064681 A1 | 5/2002 | Takiguchi et al. |
| 2002/0134984 A1 | 9/2002 | Igarashi |
| 2002/0182441 A1 | 12/2002 | Lamansky et al. |
| 2004/0068132 A1 * | 4/2004 | Lecloux et al. .......... 556/18 |

FOREIGN PATENT DOCUMENTS

WO  WO 02/15645  2/2002

OTHER PUBLICATIONS

Diez et al. "Synthesis, structural characterization, and photophysical properties of Palladium and platinum(II) complexes containing 7,8-benzoquinolate and various phosphine ligands." Inorg. Chem. 2005, vol. 44, No. 7. pp. 2443-2453.*
Shriver et al. "Inorganic Chemistry" 1994. W. H. Freeman and Company. 2nd edition. pp. 661-665.*

* cited by examiner

*Primary Examiner*—D. Lawrence Tarazano
*Assistant Examiner*—Michael Wilson
(74) *Attorney, Agent, or Firm*—Robert E. Bushnell, Esq.

(57) ABSTRACT

A cyclometalated transition metal complex emitting phosphorescence of high efficiency and an organic electroluminescent display device employing the same are provided. The cyclometalated transition metal complex is represented by Formula I:

$$\{[C\,\widehat{}\,N]_m M[P(R^1 R^2)][LR^3 R^4]_n\}_z \qquad (I).$$

The cyclometalated transition metal complex can be employed in an organic film of an organic electroluminescent display device, can emit light at a wavelength range of 400 nm to 650 nm, and can emit white light as well when used with a green light emitting material and a red light emitting material.

18 Claims, 5 Drawing Sheets

CYCLOMETALATED TRANSITION METAL COMPLEX AND ORGANIC ELECTROLUMINESCENT DISPLAY DEVICE USING THE SAME

CROSS-REFERENCE TO RELATED PATENT APPLICATION

This application claims the benefit of Korean Patent Application No. 10-2004-0090127, filed on Nov. 6, 2004, in the Korean Intellectual Property Office, the disclosure of which is incorporated herein in its entirety by reference.

BACKGROUND OF THE INVENTION

1. Field of the Invention

The present invention relates to a cyclometalated transition metal complex and an organic electroluminescent display device using the same, and more particularly, to a cyclometalated transition metal complex that can emit light at a wavelength range from blue to red region by triplet metal-to-ligand charge-transfer (MLCT), and an organic electroluminescent display device that applies the complex as an organic film forming material.

2. Description of the Related Art

An organic electroluminescent display device (organic EL display device) is an active light-emitting display device employing the phenomenon that when an electric current is applied to a thin film (hereinafter referred to as "organic film") composed of a fluorescent or phosphorescent organic compound, the fluorescent or the phosphorescent organic compound emits light in response to the recombination of electrons and holes in the organic film. The display device is light, has a structure of which the components are simple and its manufacturing process is simple, and ensures wide view angle with high image quality. Further, the display has the electrical properties suitable for portable electronic devices, since it can embody completely high color purity and moving picture, and can be driven by low consuming power and low voltage.

A general organic electroluminescent display device has a structure where an anode is formed at the upper part of a substrate, and a hole transporting layer, a light emitting layer, an electron transporting layer and a cathode are sequentially formed at the upper part of the anode. Herein, the hole-transporting layer, the light emitting layer and the electron-transporting layer are organic films composed of organic compounds. The driving principle for the organic electroluminescent display device having such a structure is as follows. When voltage is applied between the anode and the cathode, a hole injected from an anode is migrated to a light-emitting layer via a hole-transporting layer. Meanwhile, an electron is injected from a cathode into a light-emitting layer via an electron-transporting layer, and carriers are recombined at the area of the light-emitting layer to form an exciton. The exciton emits light with a wavelength corresponding to a band gap of a material when the exciton decays radiatively.

The light emitting layer-forming materials for the organic electroluminescent display device are classified into a fluorescent material using singlet excitons and a phosphorescent material using triplet excitons, according to their light-emitting mechanism. The light emitting layer is formed of the fluorescent or phosphorescent material alone or an appropriate host material doped with the fluorescent or phosphorescent material. As electrons are excited, singlet excitons and triplet excitons are formed in the host. Herein, the statistic-forming ratio of the singlet excitons to the triplet excitons is 1:3.

The organic electroluminescent display device using a fluorescent material as a light emitting layer-forming material has a disadvantage that the triplet excitons formed in the host are wasted, while the device using a phosphorescent material as a light emitting layer-forming material has an advantage that both of the singlet excitons and the triplet excitons can be used, and thus the internal quantum efficiency can reach 100%. Accordingly, when a phosphorescent material is used as a light emitting layer-forming material, the organic electroluminescent display device can possess even higher light emitting efficiency than when a fluorescent material is used.

When a heavy metal such as Ir, Pt, Rh, Pd, etc. is incorporated into an organic molecule, triplet state and singlet state are mixed through spin-orbital coupling occurred by the heavy metal atom effect. Due to this, the transition that had been blocked is possible, and the phosphorescence can be occurred efficiently even at room temperature.

Recently, a green material or a red material with high efficiency employing the phosphorescence of which the internal quantum efficiency reaches 100% was developed.

Although several materials employing transition metal compounds having transition metals such as an iridium, a platinum, etc. as a highly efficient luminescent material employing phosphorescence are reported, the materials that satisfy the properties required for realizing a full color display with high efficiency or white light emitting with low consuming power are limited to the green and red regions, and a phosphorescent material suitable for the blue region is not developed. For the foregoing reasons, there is an obstacle in developing a phosphorescent full color device.

To solve such problems, a blue light emitting material is being developed (WO02/15645 A1, US 2002/0064681 A1). Further, an organic metal complex, incorporating a bulky functional group that can make a HOMO (highest occupied molecular orbital)-LUMO (lowest unoccupied molecular orbital) gap large by changing the molecular geometry, or a functional group that has strong ligand field (e.g., cyano group), was developed. Besides, an iridium complex represented by Formula Ir(ppy)$_2$P(ph)$_3$Y (wherein Y=Cl or CN) (US 2002/0182441 A1), and an iridium (III) complex having a cyclometalated ligand, a chelating diphosphine, a 11 chlorine and a cyano group (US 2002/0048689 A1) were developed. Further, the US Serial No. 2002-0134984 discloses a light-emitting display device with a compound having a transition metal atom-phosphorus atom bond as an organic compound constituting a light-emitting layer.

However, the transition metal atom-phosphorus atom bond forms a coordinate bond through the unpaired electrons of a phosphorus atom, and thus there was a problem in that the binding force of the bond is weak.

SUMMARY OF THE INVENTION

It is therefore an object of the present invention to provide a compound for an organic film of an organic electroluminescent display device.

It is another object of the present invention to provide an improved an organic electroluminescent display device.

The present invention provides a cyclometalated transition metal complex that can emit light at a wavelength range of from blue to red region more efficiently by triplet metal-to-ligand charge-transfer (MLCT) due to excellent binding force between a transition metal atom and a ligand.

The present invention also provides an organic electroluminescent display device that can emit light at a wavelength range of from blue to red region more efficiently.

According to an aspect of the present invention, there is provided a cyclometalated transition metal complex represented by Formula I below:

$$\{[C\char`\^N]_m M[P(R^1R^2)][LR^3R^4]_n\}_n \qquad (I)$$

wherein

M is a transition metal of Ru, Rh, Ir, Os, Pt or Au;
C^N is a cyclometalated ligand;
m is 1 or 2;
L is $PR^5$, $NR^5$, $AsR^5$, O, S, Se, or Te;
$R^1$ and $R^2$ are each independently an alkyl group, an aryl group, a heteroaryl group, an amino group, an alkoxy group, an aryloxy group, a heteroaryl group, or an oxyamino group;
$R^3$, $R^4$, and $R^5$ are each independently a hydrogen atom, an alkyl group, an alkynyl group, an aryl group, an amino group, an alkoxy group, an aryloxy group, an acyl group, an alkoxycarbonyl group, an acyloxy group, an acylamino group, an alkoxycarbonylamino group, an aryloxycarbonylamino group, a sulfonylamino group, a sulfamoyl group, a carbamoyl group, an arylthio group, a heteroarylthio group, a sulfonyl group, a sulfinyl group, an ureido group, a phosphoramide group, a hydroxy group, a mercapto group, a halogen atom, a cyano group, a sulfo group, a carboxy group, a nitro group, a hydroxamic group, a heterocyclic group, a silyl group, or a phosphino group;
P is a phosphorus atom;
n is 0 or 1; and
z is 1 or 2.

According to another aspect of the present invention, there is provided an organic electroluminescent display device, comprising: a pair of electrodes; and an organic film between the electrodes, the organic film comprising a compound having a cyclometalated transition metal complex having a transition metal and a phosphorus atom covalently bound to the transition metal.

According to another aspect of the present invention, there is provided an organic electroluminescent display device including an organic film between a pair of electrodes, wherein the organic film comprises a cyclometalated transition metal complex represented by Formula I.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
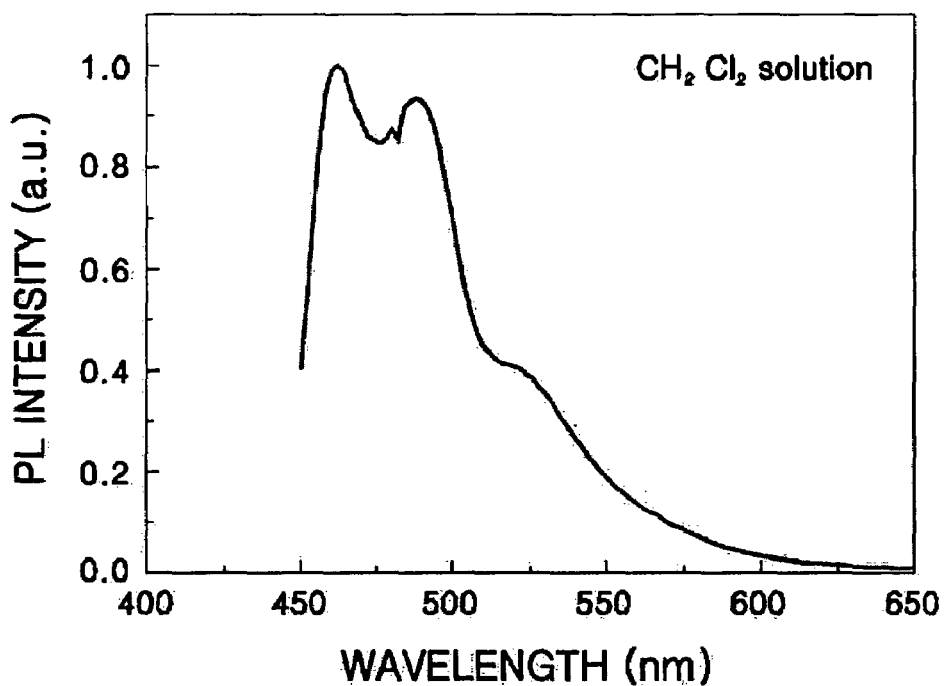
FIG. 1 is the photoluminescence (PL) spectrum of a compound according to Example 1 of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

The present invention provides an organic electroluminescent display device that can emit light at a wavelength range of blue and have excellent stability, since a phosphorus atom in the cyclometalated transition metal complex according to the present invention has anionic property, thereby having a covalent bond which is stronger than a coordinate bond which is included in the prior art compound.

A cyclometalated transition metal complex according to an embodiment of the present invention has a structure represented by Formula I:

$$\{[C\char`\^N]_m M[P(R^1R^2)][LR^3R^4]_n\}_z \qquad (I)$$

wherein

M is a transition metal of Ru, Rh, Ir, Os, Pt or Au;
C^N is a cyclometalated ligand;
m is 1 or 2;
L is $PR^5$, $NR^5$, $AsR^5$, O, S, Se, or Te;
$R^1$ and $R^2$ are each independently an alkyl group, an aryl group, a heteroaryl group, an amino group, an alkoxy group, an aryloxy group, a heteroaryl group, or an oxyamino group;
$R^3$, $R^4$, and $R^5$ are each independently a hydrogen atom, an alkyl group, an alkynyl group, an aryl group, an amino group, an alkoxy group, an aryloxy group, an acyl group, an alkoxycarbonyl group, an acyloxy group, an acylamino group, an alkoxycarbonylamino group, an aryloxycarbonylamino group, a sulfonylamino group, a sulfamoyl group, a carbamoyl group, an arylthio group, a heteroarylthio group, a sulfonyl group, a sulfinyl group, an ureido group, a phosphoramide group, a hydroxy group, a mercapto group, a halogen atom, a cyano group, a sulfo group, a carboxy group, a nitro group, a hydroxamic group, a heterocyclic group, a silyl group, or a phosphino group;
P is a phosphorus atom;
n is 0 or 1; and
z is 1 or 2.

The cyclometalated transition metal complex according to the present invention is characterized in that a phosphorus atom is covalently bound to a transition metal. Thus, the cyclometalated transition metal complex according to the present invention has thermal stability superior to the conventional transition metal complexes, shifts the light-emitting wavelength toward blue region, and has excellent light-emitting efficiency, since the phosphorus-transition metal bond in the conventional transition metal complex was a coordinate bond weaker than a covalent bond.

The phosphorus atom in Formula I is covalently bound to a transition metal in the state of having two substituents. In the prior art, the phosphorus atom could not bind covalently to a transition metal due to having three substituents. In the present invention, however, the phosphorus atom can bind covalently to a transition metal because the phosphorus atom has two substituents, and thus its binding strength is excellent so that its thermal stability is excellent. This is possible whether there are additional ligands other than a phosphorus ligand in a transition metal or not. If there are other ligands in a transition metal, the covalent bond between a phosphorus atom and a transition metal can be maintained by using a ligand having neutral donating property.

In Formula I, $R^1$ and $R^2$ may be each independently a hydrogen atom, an aryl group having $C_6$-$C_{30}$, preferably $C_6$-$C_{20}$, and more preferably $C_{6\text{-}12}$, an aryloxy group having $C_6$-$C_{30}$, preferably $C_6$-$C_{20}$, and more preferably $C_{6\text{-}12}$, an aryloxycarbonyl group having $C_7$-$C_{30}$, preferably $C_7$-$C_{20}$, and more preferably $C_{7\text{-}12}$, a heteroaryl group having $C_4$-$C_{30}$, preferably $C_4$-$C_{20}$, and more preferably $C_{4\text{-}11}$, a thioaryl group having $C_4$-$C_{30}$, preferably $C_4$-$C_{20}$, and more preferably $C_{5\text{-}11}$, an aralkyl group having $C_6$-$C_{30}$, preferably $C_6$-$C_{20}$, and more preferably $C_{7\text{-}13}$, a heteroaralkyl group having $C_6$-$C_{30}$, preferably $C_6$-$C_{20}$, and more preferably $C_{6\text{-}12}$, an aralkenyl group having $C_7$-$C_{30}$, preferably $C_7$-$C_{20}$, and more preferably $C_{7\text{-}14}$.

In Formula I, the number of the cyclometalated ligand represented by (C^N) may be or two, and when the number of the ligand is two, the ligands may be the same or different to each other, and the ligand may be any one selected from the group consisting of the compounds below:

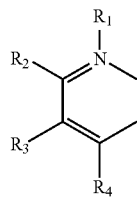
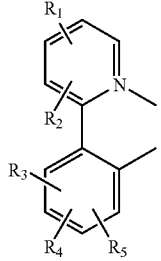
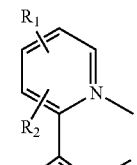
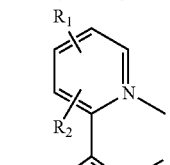
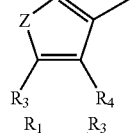
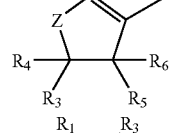
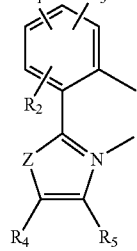
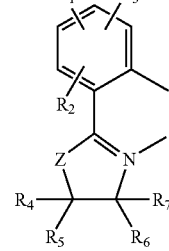

-continued

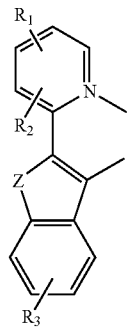
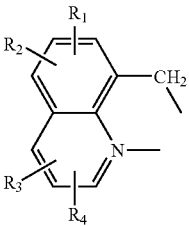
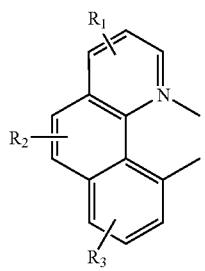
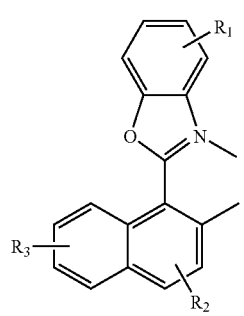
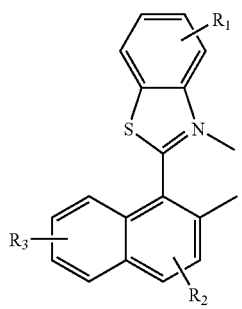
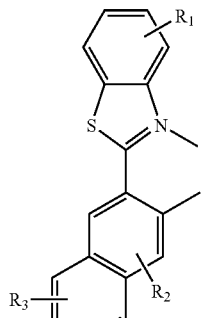
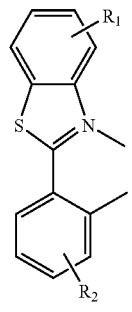
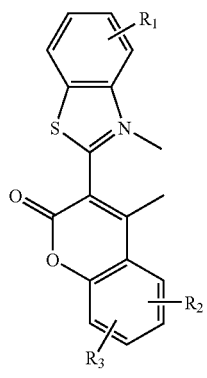
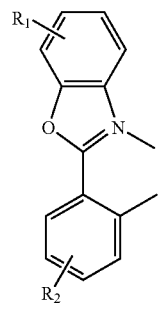

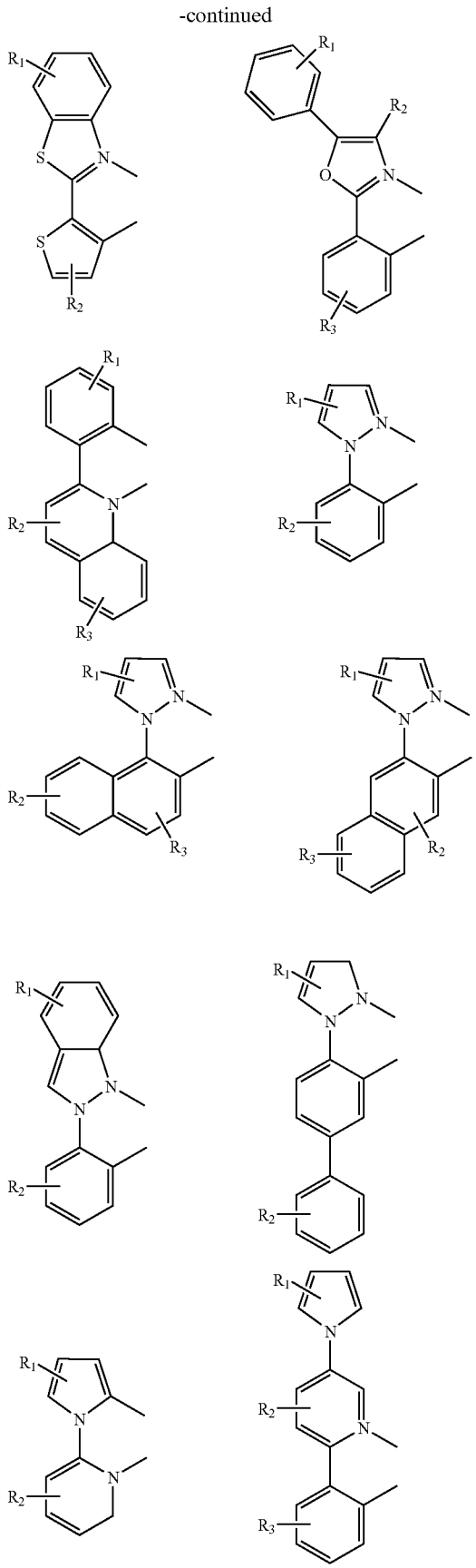

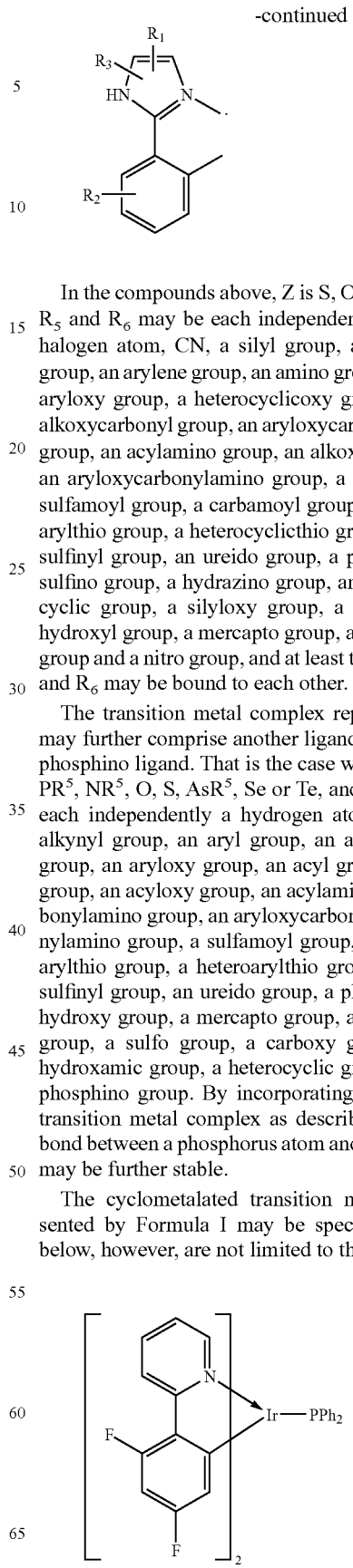

In the compounds above, Z is S, O or $NR_1$, $R_1$, $R_2$, $R_3$, $R_4$, $R_5$ and $R_6$ may be each independently a hydrogen atom, a halogen atom, CN, a silyl group, an alkyl group, an aryl group, an arylene group, an amino group, an alkoxy group, an aryloxy group, a heterocyclicoxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclicthio group, a sulfonyl group, a sulfinyl group, an ureido group, a phosphoramide group, a sulfino group, a hydrazino group, an imino group, a heterocyclic group, a silyloxy group, a hydroxaminic group, a hydroxyl group, a mercapto group, a sulfo group, a carboxyl group and a nitro group, and at least two of $R_1$, $R_2$, $R_3$, $R_4$, $R_5$ and $R_6$ may be bound to each other.

The transition metal complex represented by Formula I may further comprise another ligand besides a disubstituted phosphino ligand. That is the case when n is 1, wherein L is $PR^5$, $NR^5$, O, S, $AsR^5$, Se or Te, and $R^3$, $R^4$ and $R^5$ may be each independently a hydrogen atom, an alkyl group, an alkynyl group, an aryl group, an amino group, an alkoxy group, an aryloxy group, an acyl group, an alkoxycarbonyl group, an acyloxy group, an acylamino group, an alkoxycarbonylamino group, an aryloxycarbonylamino group, a sulfonylamino group, a sulfamoyl group, a carbamoyl group, an arylthio group, a heteroarylthio group, a sulfonyl group, a sulfinyl group, an ureido group, a phosphor amido group, a hydroxy group, a mercapto group, a halogen atom, a cyano group, a sulfo group, a carboxy group, a nitro group, a hydroxamic group, a heterocyclic group, a silyl group, or a phosphino group. By incorporating further ligand into the transition metal complex as described above, the covalent bond between a phosphorus atom and a transition metal atom may be further stable.

The cyclometalated transition metal complexes represented by Formula I may be specifically the compounds below, however, are not limited to these:

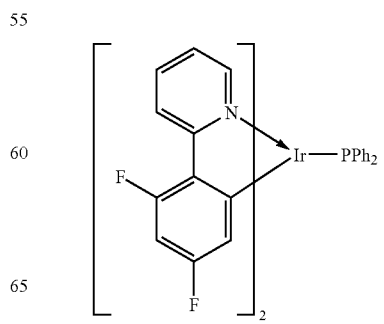

-continued

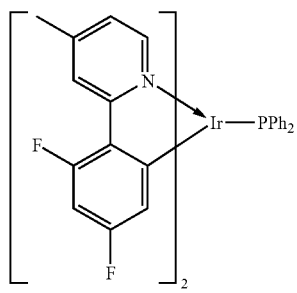

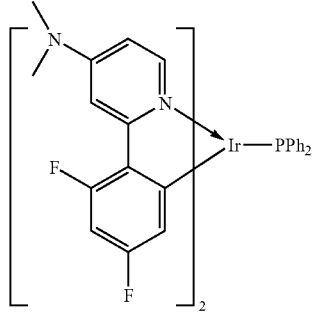

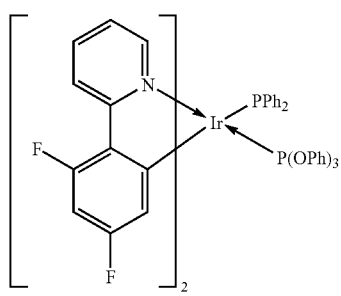

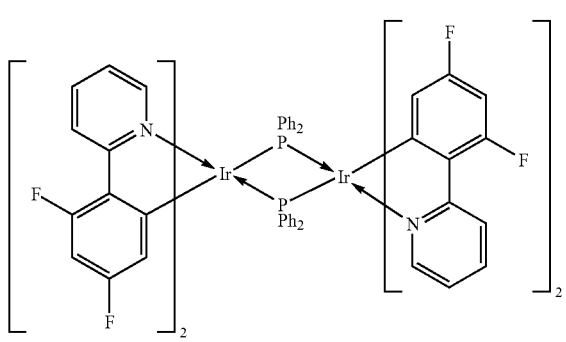

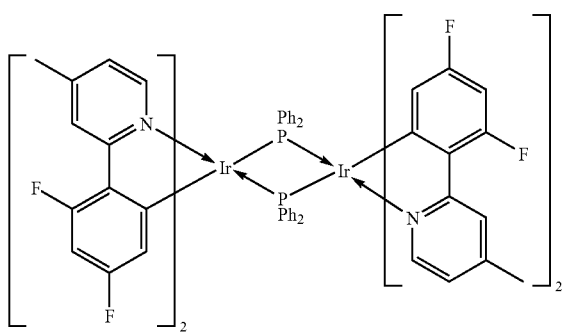

-continued

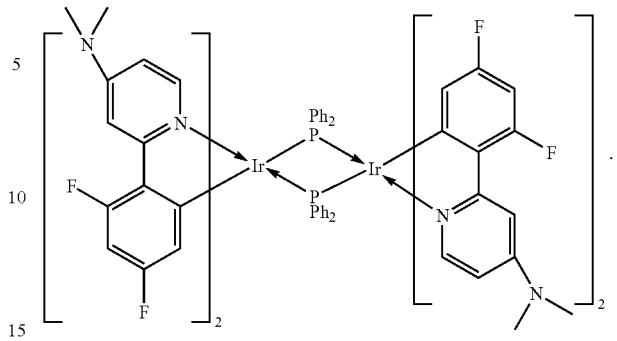

When the compound represented by Formula I has only a disubstituted phosphorus ligand, the compound may be in a dimer form represented by Formula II below as well as in a monomer form:

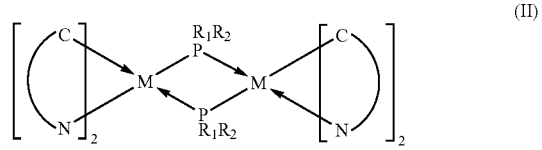

(II)

wherein M, $R_1$, $R_2$, P and C^N are the same as defined in Formula I.

When M is Ru(III), Rh(III), Ir(III), Os(III) or Au(III), the compound can be represented similarly to Formula II, and when M is Ru(II) or Pt(II), the compound can be represented in the form a dimer wherein the number of C^N is 1 (m=1), and the number of $LR_3R_4$ is 1 (n=1).

The transition metal complex according to an embodiment of the present invention has light-emitting property at a wavelength range of 400 nm to 650 nm.

The transition metal complex according to an embodiment of the present invention can be synthesized by using the starting material $[Ir(C^{\wedge}N)_2Cl]_2$ derivative that provides a cyclometalated moiety according to the method reported by Watts and his colleagues (F. O. Garces, R. J. Watts, Inorg. Chem. 1988, (35), 2450, which is incorporated herein by reference).

Hereinafter, the synthetic method will be described concerning the synthetic pathways of an iridium complex according to an embodiment of the present invention.

The starting material $[Ir(C^{\wedge}N)_2Cl]_2$ derivative and a diphenylphosphino potassium are mixed with a solvent such as a 1,2-dichloromethane, a methylene chloride, THF, etc., and the mixture was stirred for 2 to 48 hours at room temperature to obtain $[Ir(C^{\wedge}N)_2P[(Ph_2)]$ compound:

Reaction scheme I

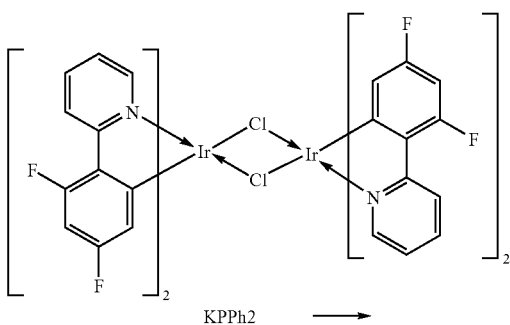

KPPh2 →

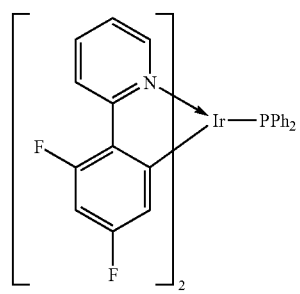

+

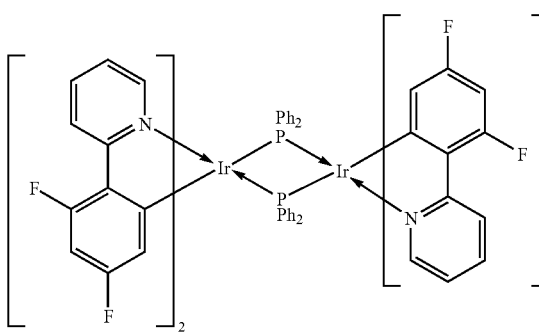

The resulting product may be in the form of a monomer or a dimmer as described in the reaction scheme I.

When the transition metal complex has a further ligand, for example, P(OPh)$_3$ besides the phosphorus ligand, the starting material [Ir(C^N)$_2$Cl]$_2$ derivative and P(OPh)$_3$ are reacted in a solvent such as a dichloromethane or THF for 12 hours, as shown in the reaction scheme II below, and then the resulting product is separated using a silica gel column. Thus, the separated Ir(C^N)$_2$Cl[P(OPh)$_3$] is dissolved in THF solvent, a diphenylphosphinopotassium is slowly added to the solution to allow the mixture to react for 12 hours, and the resulting product is separated through a silica gel column to obtain the transition metal complex:

Reaction scheme II

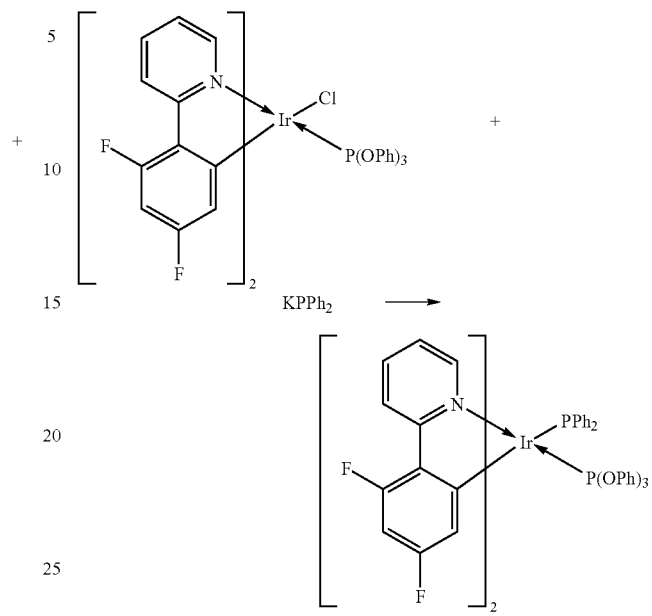

The organic electroluminescent device according to the present invention is prepared by forming an organic film, particularly a light emitting layer employing the cyclometalated transition metal complex according to the present invention. The transition metal complex represented by Formula I is very useful as a phosphorescent dopant material that is a light emitting layer-forming material, and provides excellent light-emitting properties in the range of blue wavelengths.

When the cyclometalated transition metal complex according to the present invention is used as a phosphorescent dopant, an organic film may further comprise at least one selected from the group consisting of at least one of polymer hosts, a mixed host of a polymer and a small molecule compound, a small molecule host, and a non-luminescent polymer matrix. Herein, any materials that are typically used for forming a light-emitting layer for an organic electroluminescent device can be used as the polymer host, the small molecule host and a non-luminescent polymer matrix. The polymer host includes a polyvinylcarbazole (PVK) and a polyfluorene, etc., the small molecule host includes a 4,4'-N, N'-dicarbazole-biphenyl (CBP), a 4,4'-bis[9-(3,6-biphenyl-carbazolyl)]-1,1'-biphenyl, a 9,10-bis[(2',7'-t-butyl)-9',9''-spiro bifluorenyl anthracene and a tetrafluorene, etc., and a non-luminescent polymer matrix includes a polymethylmethacrylate and a polystyrene, etc., however, these are not limited to the above examples.

The amount of the cyclometalated transition metal complex according to an embodiment of the present invention may be 1 to 30 parts by weight, based on 100 parts by weight of the total weights of the light-emitting layer-forming material. The incorporation of such a transition metal complex into the light-emitting layer can be carried out by vacuum vapor deposition, sputtering, printing, coating, ink jetting, or a method using electronic beam, etc.

Further, the transition metal complex according to the present invention can emit white light with the use of a green light-emitting material and a red light-emitting material together.

The thickness of the organic film may be 30 nm to 100 nm. The organic film used herein refers to a film of an organic compound, which is formed between a pair of electrodes in an organic electroluminescent display device, such as an electron transporting layer and a hole transporting layer, in addition to a light emitting layer. Such an organic electroluminescent display device can have commonly known various structures, such as anode/light emitting layer/cathode, anode/buffer layer/light emitting layer/cathode, anode/hole transporting layer/light emitting layer/cathode, anode/buffer layer/hole transporting layer/light emitting layer/cathode, anode/buffer layer/hole transporting layer/light emitting layer/electron transporting layer/cathode, anode/buffer layer/hole transporting layer/light emitting layer/hole blocking layer/cathode and the like, but the structures are not limited to these.

The buffer layer can be composed of a material commonly used for a conventional buffer layer, and may be composed of a copper phthalocyanine, a polythiophene, a polyaniline, a polyacetylene, a polypyrrole, a polyphenylene vinylene or their derivatives, however, the material is not limited to these examples.

The hole transporting layer can be composed of a material commonly used for a conventional hole transporting layer, and may be composed of, but is not limited to, a polytriphenylamine.

The electron transporting layer can be composed of a material commonly used for a conventional electron transporting layer, and may be composed of, but is not limited to, a polyoxadiazole.

The hole blocking layer can be composed of a material commonly used for a conventional hole blocking layer, and may be composed of, but is not limited to, LiF, $BaF_2$ or $MgF_2$ and the like.

The organic electroluminescent display device according to the present invention can be prepared by a conventional method of manufacturing an organic electroluminescent display device employing common luminescent materials, and thus does not need any special apparatuses or processes.

The cyclometalated transition metal complex according to an embodiment of the present invention can emit light at a wavelength range of 400 nm to 650 nm. The light emitting diode employing such a cyclometalated transition metal complex can be used in light source illumination for displaying full color, backlight, an outdoor bulletin board, optical communication, and interior decoration, etc.

The present invention will be described in greater detail with reference to the following examples. The following examples are for illustrative purposes and are not intended to limit the scope of the invention.

EXAMPLES

Reference Example 1

Synthesis of $F_2$ppy Dimer

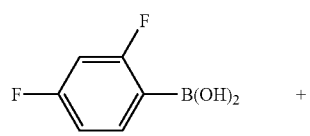

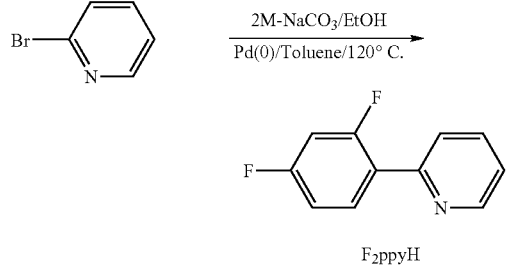

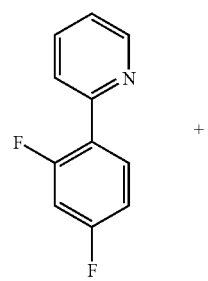

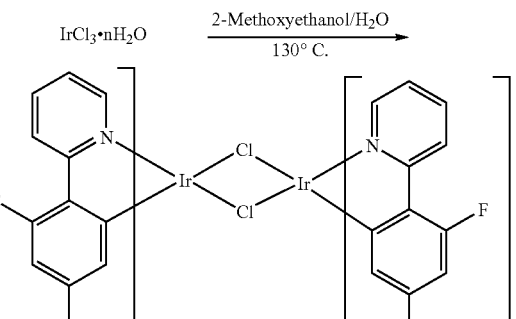

$F_2$ppy Dimer

To a 500 ml flask with a side arm, 19.85 g (1.25×10⁴ mmol) of 2-bromopyridine, 25.00 g (1.58×10⁴ mmol) of a 2,4-difluorophenyl boronic acid, 100 ml of a toluene, 48 ml of an ethanol and 2M sodium carbonate solution in 95 ml of water were added, and the mixture was agitated under nitrogen atmosphere at room temperature. Then, 4.53 g (3.92 mmol) of a tetrakis(triphenylphosphine)palladium(0) were added to the reaction mixture, and the mixture was refluxed under the nitrogen atmosphere for 15 hrs in a dark room.

After the temperature of the reaction mixture was returned to room temperature on completion of the reaction, an organic layer was extracted using ethyl acetate and water. Then, the extract was separated by column chromatography (toluene:hexane=10:1) to obtain a pale brown liquid ($F_2$ppyH).

$^1$H-NMR(CD$_2$Cl$_2$,ppm): 8.69(d, 1H), 8.03(m, 1H), 7.70 (m, 2H), 7.27(m, 1H), 7.00(m, 2H).

By using 2-(4,6-difluorophenylpyridine)monomer and IrCl$_3$.nH$_2$O synthesized according to the procedure, a yellow powder $F_2$ppy dimer was synthesized. Herein, the synthesis was performed with reference to J. Am. Che. Soc., 1984, 106, 6647-6653, which is incorporated herein by reference.

$^1$H-NMR(CD$_2$Cl$_2$,ppm): 9.1(d, 4H), 8.3(d, 4H), 7.9(t, 4H), 6.9(m, 4), 6.5(m, 4H), 5.3(d, 4H).

Reference Example 2

Synthesis of F$_2$pmp Dimer

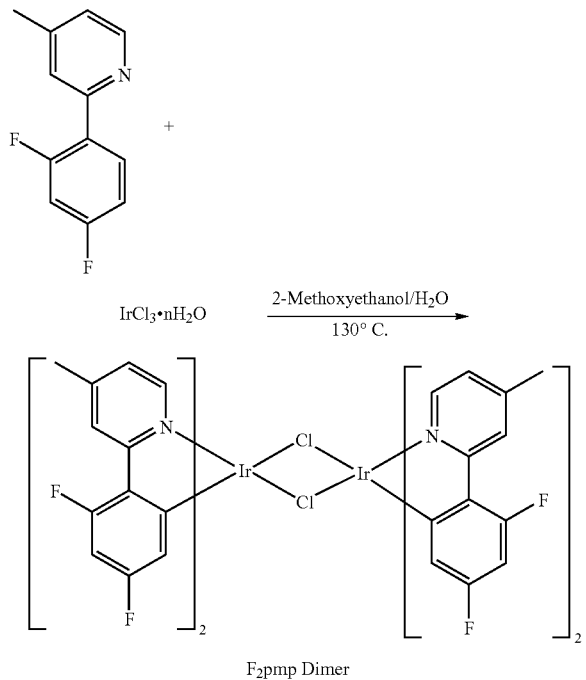

F$_2$pmp Dimer

An F$_2$pmp dimer was synthesized by using the same method as in the reference example 1, except that a 2-bromo-4-methylpyridine was used instead of a 2-bromopyridine.

$^1$H-NMR(CD$_2$Cl$_2$,ppm): 8.9(d, 4H), 8.1(s, 4H), 6.6(d, 4H), 6.3(m, 4H), 5.3(d, 4H), 2.6(s, 12H).

Reference Example 3

Synthesis of DMAF$_2$ppy Dimer

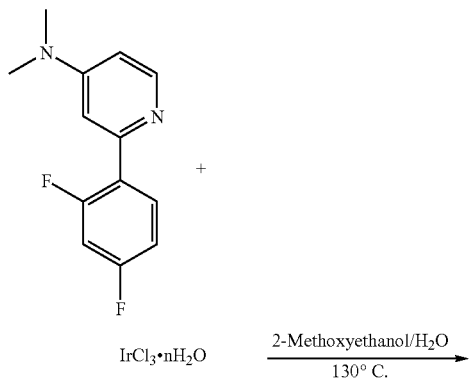

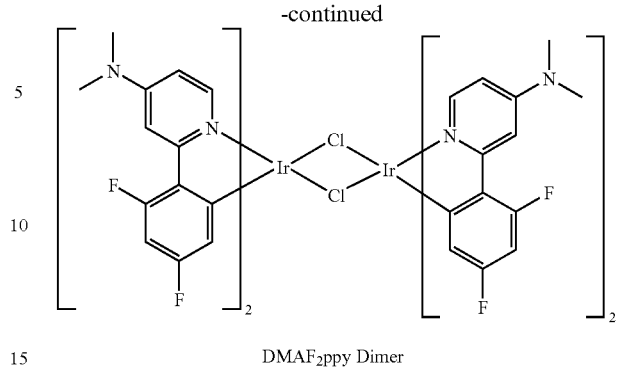

DMAF$_2$ppy Dimer

A DMAF$_2$ppy dimer was synthesized by using the same method as in the reference example 1, except that 25.26 g (1.25×10$^4$ mmol) of a 2-bromo-4-dimethylaminopyridine were used instead of a 2-bromopyridine.

$^1$H-NMR(CD$_2$Cl$_2$,ppm): 8.7(d, 4H), 7.5(t, 4H), 6.3(m, 4H), 6.1(m, 4H) 5.4(d, 4H), 3.2(s, 24H).

Hereinafter, the methods of preparing a cyclometalated transition metal compound having a diphenyl-substituted phosphorus atom ligand according to the present invention, and a light emitting material having a triphenyl-substituted phosphorus atom ligand according to the prior art will be described.

The NMR and TGA were performed for identifying the compounds of each example, and the PL and EL spectrum were analyzed for investigating the light emitting characteristics.

The light emitting characteristics was investigated by the following method.

After the compound was dissolved in a methylene chloride solution to give 10$^{-4}$ M solution, the light emitting characteristics at the state of the methylene chloride solution was investigated.

The EL display device used in measuring the light emitting characteristics has the following multilayer structure, and its light emitting area is 9 mm$^2$:

substrate/first electrode/hole injecting layer/hole transporting layer/light emitting layer/hole blocking layer/ electron transporting layer/electron injecting layer/second electrode=
glass/ITO/PEDOT(50 nm)/PVK(1)mCP(3.7)Dopant(19% or 25.5%)/BAlq (40 nm)/LiF(0.8 nm)/Al(200 nm).

Example 1

Preparation of Compound (1)

In the 100 ml 2-neck flask, 50 ml of THF were added to 1.0 g (0.82 mmol) of [(F$_2$ppy)$_2$IrCl]$_2$ prepared in the reference example 1 under nitrogen atmosphere. After 3.5 ml (1.75 mmol) of 0.5M KPPh$_2$ THF solution were added dropwise to the slurry solution, the mixture was stirred for about 24 hrs at room temperature. On completion of the reaction, the solvent was removed under reduced pressure, and then the reaction mixture was dissolved in a dichloromethane, and a column chromatography was performed using a silica gel, and a methanol and a dichloromethane as solvents. The resulting product was fully dried in vacuum to give 434 mg (yield: 35%) of a pale yellow solid. The anticipated structure may be present in the form of a monomer or a dimer (Reaction scheme I).

¹H-NMR(CD₂Cl₂, 300 MHz, ppm): 9.37(d, 1H), 8.86(d, 1H), 8.34(dd, 1H), 8.05(d, 1H), 7.73(t, 1H) 7.54(t, 1H), 7.51 (t, 2H), 7.41~7.18(m, 8H) 7.04(t, 2H), 6.86(t, 1H), 6.42(doublet of triplet, 1H), 6.29(doublet of triplet, 1H), 5.77(dd, 1H)

Example 2

Preparation of Compound (2)

The compound (2) was synthesized in the same method as in Example 1, except that 1.042 g (0.84 mmol) of a (F₂pmp)₂IrCl₂ were used instead of a (F₂ppy)₂IrCl₂. For the compound (2), two compounds were separated by performing column chromatography using silica gel. A portion eluted first was a compound that emitted light-green light on irradiating UV, and the color of the compound was pale yellow. A portion eluted later was a compound that emitted blue light on irradiating UV, and the compound was colorless. The yields of the compounds are 8% and 34%, respectively. ¹H NMR of the compound that showed blue PL spectrum, i.e., the colorless compound is as follows. The structure of the compound showing light-green PL could not be easily predicted with ¹H NMR, and thus the PL spectrum was only shown in FIG. 2. The PL spectrum of the compound showing blue PL was also shown in FIG. 2. The anticipated structure of the compound showing blue PL may be present in the form of a monomer or a dimmer, and ¹H NMR of the compound was as follows.

¹H-NMR(CDCl₃, 300 MHz, ppm): 9.50(d, 1H), 9.16(d, 1H), 8.08(m, 2H), 7.46(d, 1H), 7.08(m, 2H) 6.83(m, 7H), 6.57(d, 1H), 6.28(m, 2H), 6.14(dd, 1H), 5.51(dd, 1H), 5.18 (dd, 1H), 2.76(s, 3H), 2.41(s, 3H)

Example 3

Preparation of Compound (3)

The compound (3) was synthesized in the same method as in the example 1, except that 1.140 g (0.82 mmol) of a (dmaF₂ppy)₂IrCl₂ prepared in the reference example 3 were used instead of a (F₂ppy)₂IrCl₂. The yield of the compound (3) was 20%.

¹H-NMR(CDCl₃, 300 MHz, ppm): 7.76~7.72(m, 3H), 7.58~7.35(m, 8H), 6.94(dd, 1H), 6.82~6.74(m, 5H), 6.34(m, 1H), 5.79(m, 1H), 5.56(dd, 1H), 2.94(s, 6H)

Example 4

Preparation of Compound (4)

1.0 g (0.082 mmol) of a dimer [(F₂ppy)₂IrCl]₂ prepared in the reference example 1 and 527 mg (1.70 mmol) of P(OPh)₃ were mixed to give 90% yield (1.35 g) of (F₂ppy)₂IrCl[P (OPh)₃]. 1.1 ml (2.2 mmol) of 0.5M KPPh₂ THF solution were slowly added to 0.918 g (1.0 mmol) of the resulting (F₂ppy)₂IrCl[P(OPh)₃], and the mixture was stirred for 12 hours at room temperature to give the compound (4). The yield of the compound (4) was 50%.

¹H-NMR(CDCl₃, 300 MHz, ppm): 9.68(d, 1H), 9.48(d, 1H), 8.32(dd, 1H), 8.08(d, 1H), 7.83~7.69(m, 5H), 7.50~7.34 (m, 4H), 7.12~6.94(m, 14H), 6.74(dd, 6H), 6.31(m, 2H), 5.62(d, 1H), 5.20(m, 1H)

Comparative Example 1

Flrpic Compound

The F₂ppy prepared in the reference example 1 was treated with 2 equivalents of a picolinic acid while refluxing with a 1,2-dichloroethanol for 16 hours under inert gas atmosphere. After the treated product was cooled to room temperature, the solvent was removed under reduced pressure, and yellow crude product was washed with methanol to remove unreacted picolinic acid. After flash chromatography was performed on the crude product, the solvent was evaporated and the product was dried to give about 75% yield of pure yellow Flrpic. After the obtained bis[2-(4,6-difluorophenyl)pyridinato-N,C2']iridium picolinate (Flrpic) compound was purified through 2 rounds of sublimation, the light emitting characteristics, the color coordinate and the degradation temperature of the device structure below were measured:

Device structure: PEDOT(20 nm)/PVK+Flrpic 5 wt %(40 nm)/BCP(20 nm)/Alq3 (40 nm)/LiF/Al.

Comparative Example 2

Flrpic Compound

The display device was manufactured with the same method as in the comparative example 1, except that 10 wt % of Flrpic compound was used. Then, the light emitting characteristics, the color coordinate and the degradation temperature of the device structure below were measured:

Device structure: PEDOT(20 nm)/PVK+Flrpic 10 wt %(40 nm)/BCP(20 nm)/Alq3 (40 nm)/LiF/Al.

The light emitting characteristics, the color coordinate and the degradation temperature of the phosphorescent light emitting material prepared in the examples and the comparative examples were summarized in table 1 below.

TABLE 1

| Example No. | $\lambda_{max}$(nm) | color coordinate (CIE) |
|---|---|---|
| Example 1 | 462, 488 | EL (0.18, 0.24) |
| Example 2 | 443, 470 | PL (0.15, 0.15) |
| Example 3 | 455 | PL (0.15, 0.13) |
| Example 4 | 462 | PL (0.15, 0.22) |
| Comp. Example | 470, 494(sh) | EL (0.17, 0.32) |
| Comp. Example | 470, 494(sh) | EL (0.17, 0.33) |

As shown in Table 1, when incorporating a phosphorus atom ligand having a diphenyl substituent, the phosphorescent light emitting material according to the present invention provided the result that the region of light-emitting wavelength was shifted to the blue region compared to the prior art Flrpic. Of course, although the efficiency for Example 1 was only about half that for Flrpic, it seemed that the result was due to non-optimization. Flrpic was used with a proportion at optimal condition under depositing condition.

Figure 2:
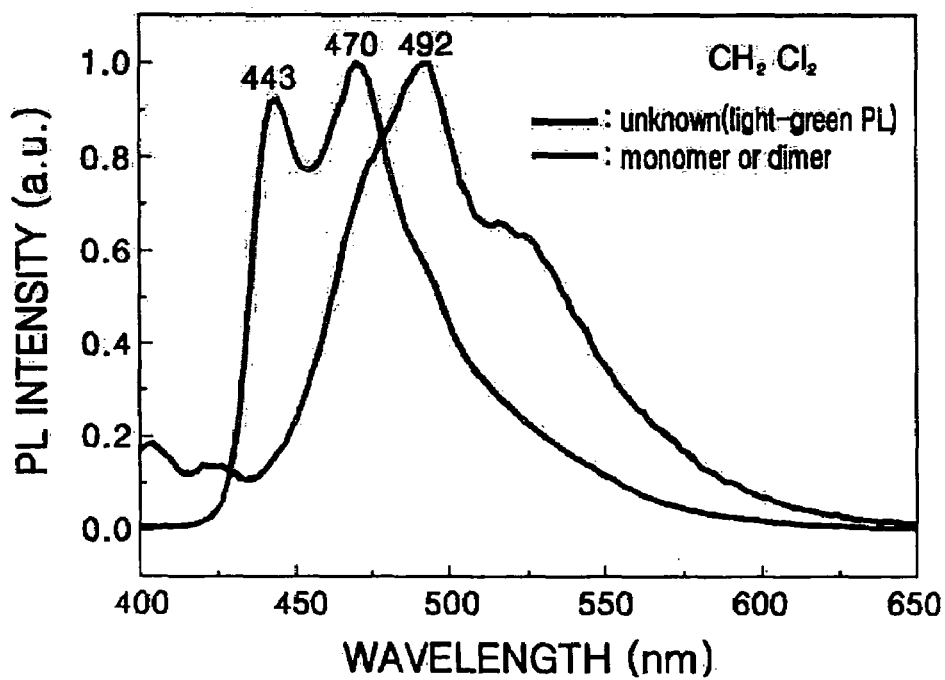
FIG. 2 is the photoluminescence (PL) spectrum of a compound according to Example 2 of the present invention.
Figure 3:
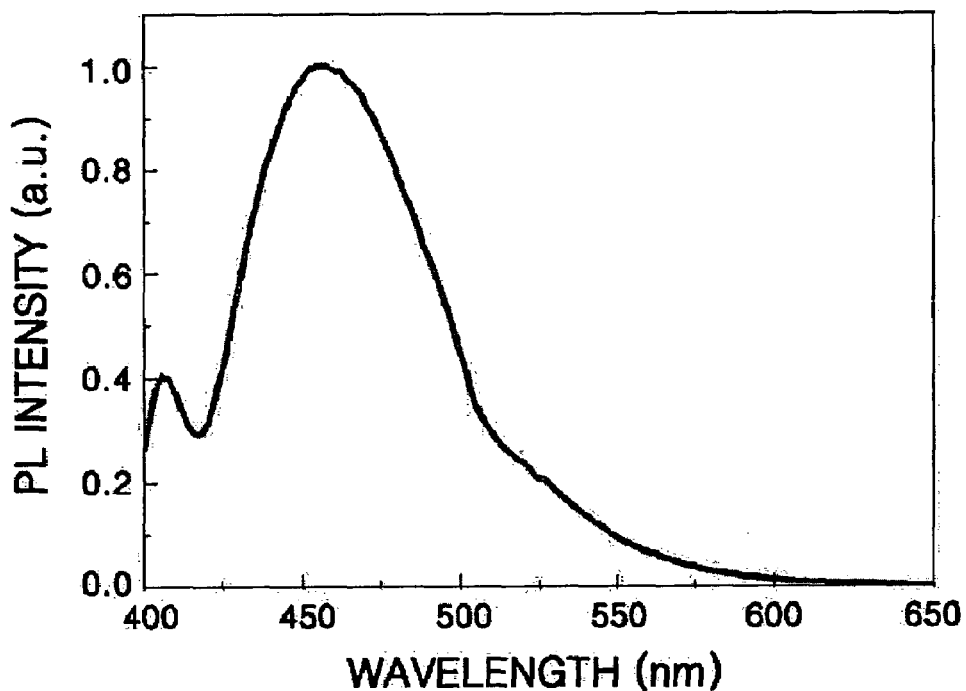
FIG. 3 is the photoluminescence (PL) spectrum of a compound according to Example 3 of the present invention.
Figure 4:
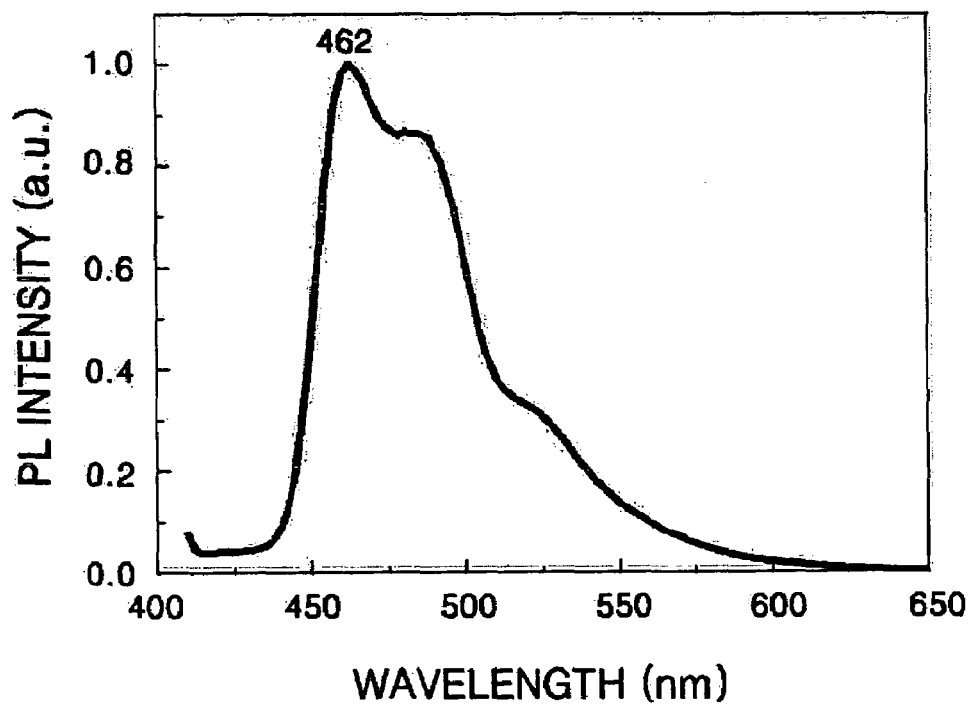
FIG. 4 is the photoluminescence (PL) spectrum of a compound according to Example 4 of the present invention.

FIG. 1 is the photoluminescence (PL) spectrum of a compound according to Example 1 of the present invention, FIG. 2 is the photoluminescence (PL) spectrum of a compound according to Example 2 of the present invention, FIG. 3 is the photoluminescence (PL) spectrum of a compound according to Example 3 of the present invention, and FIG. 4 is the photoluminescence (PL) spectrum of a compound according to Example 4 of the present invention.

Referring to FIG. 2, the transition metal complex having a phosphorus ligand was obtained with a compound having unidentified structure and showing light-green photoluminescence, and was separated using column chromatography. The leading products for the Examples 1 to 3 are anticipated to be present in the form of a monomer or a dimer.

Figure 5:
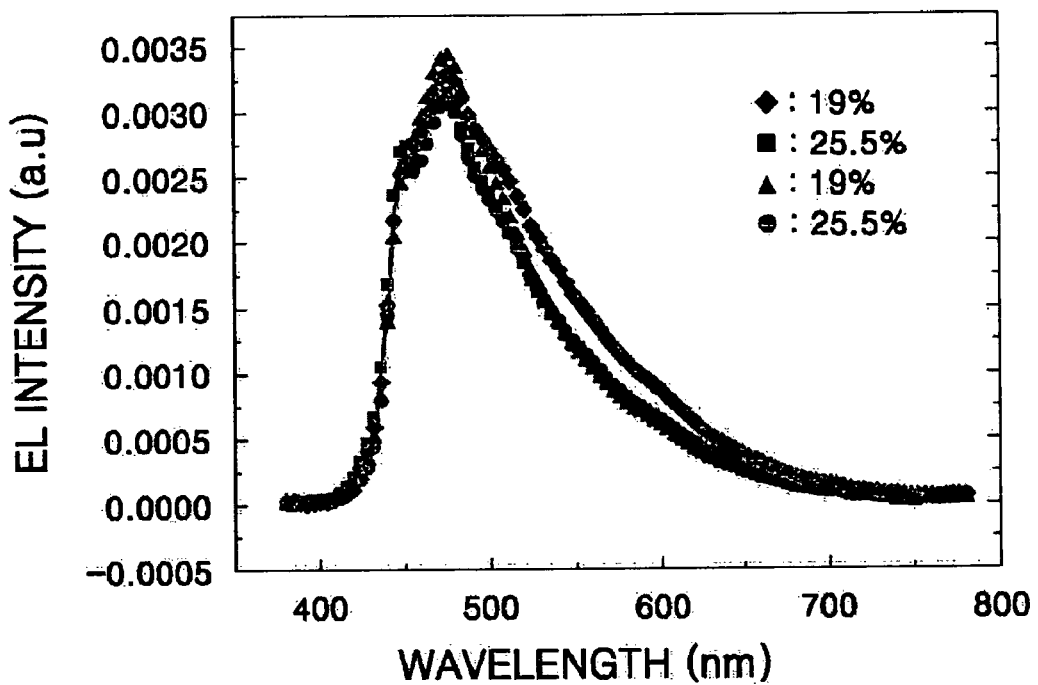
FIG. 5 is the electroluminescence (EL) spectrum of a compound according to Example 1 of the present invention.
Figure 6:
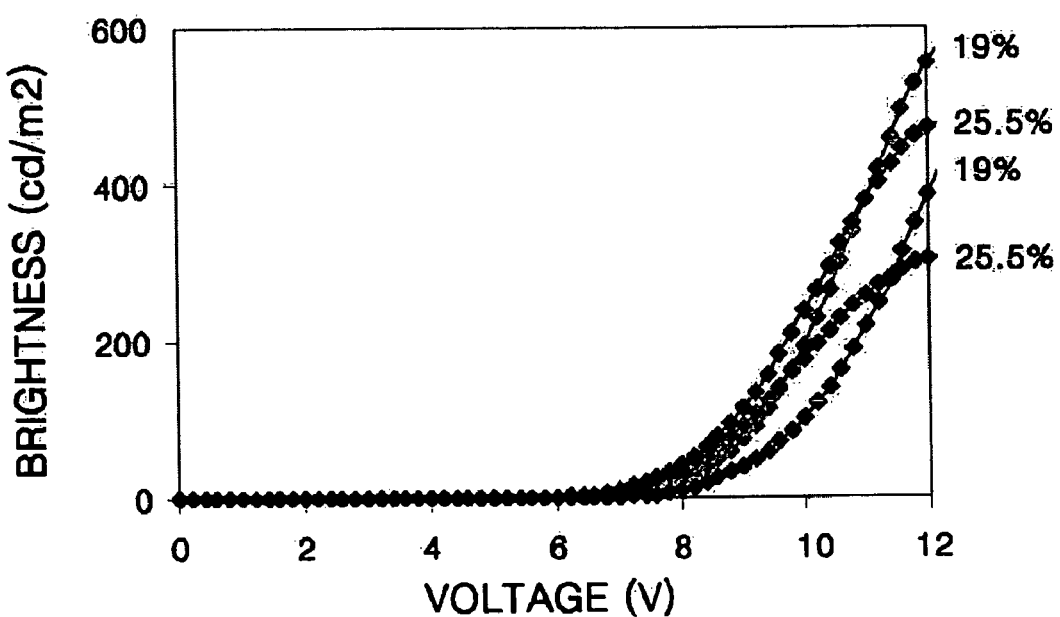
FIG. 6 is a graph showing the brightness of a compound according to Example 1 of the present invention.
Figure 7:
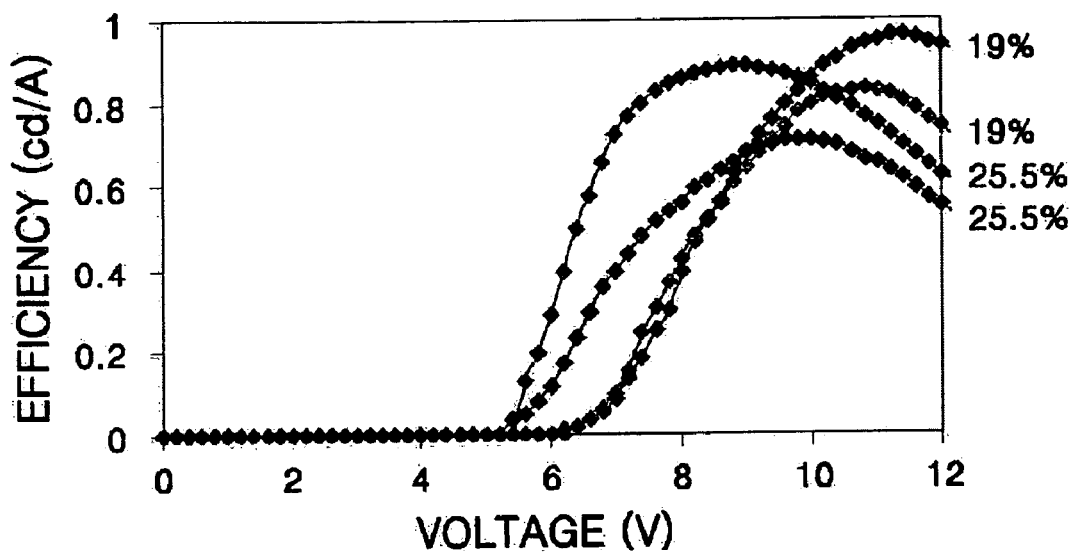
FIG. 7 is a graph showing the electric power efficiency of a compound according to Example 1 of the present invention.
Figure 8:
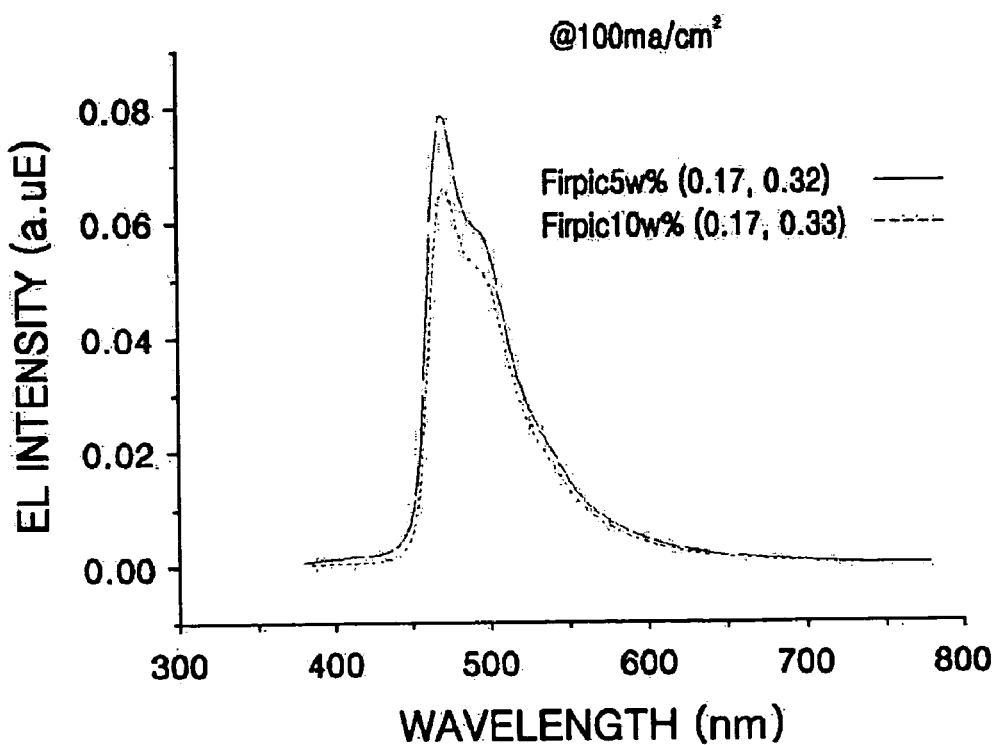
FIG. 8 is the electroluminescence (EL) spectrum of compounds according to Comparative examples 1 and 2 of the present invention.
Figure 9:
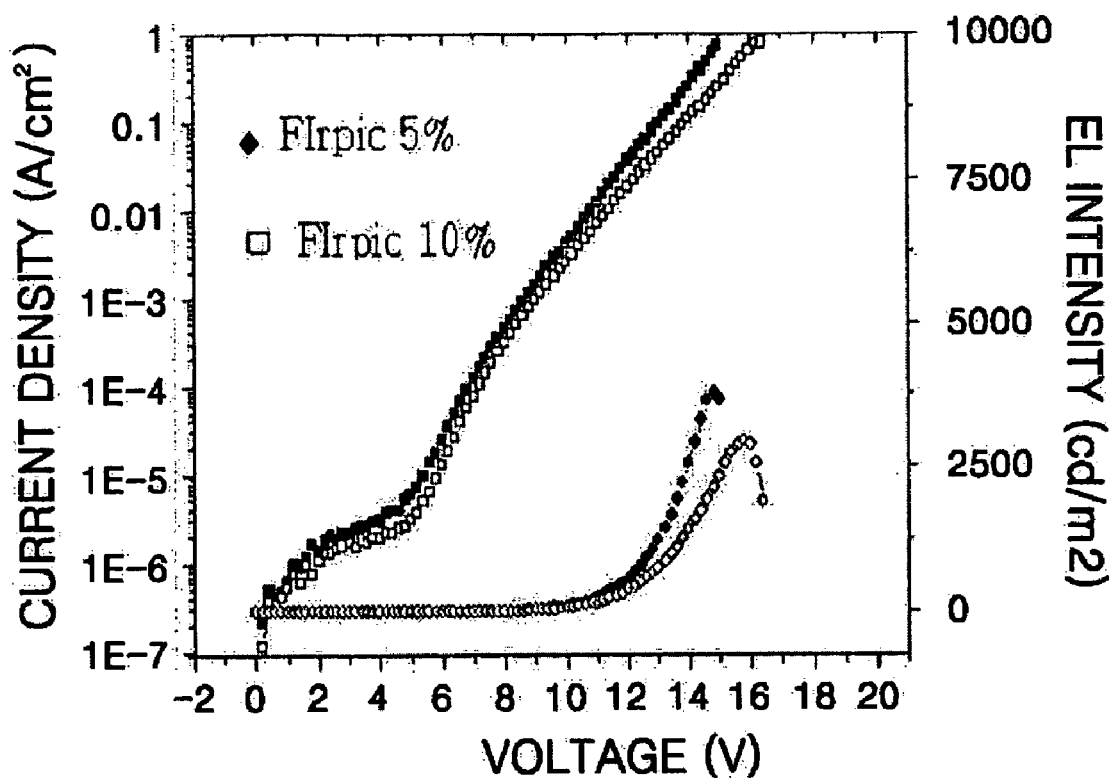
FIG. 9 is a graph showing the current-voltage-luminance (I-V-L curve) of compounds according to Comparative examples 1 and 2 of the present invention.

FIG. 5 is the electroluminescence (EL) spectrum of a compound according to Example 1 of the present invention, FIG. 6 is a graph showing the brightness of a compound according to Example 1 of the present invention, FIG. 7 is a graph showing the electric power efficiency of a compound according to Example 1 of the present invention. In FIGS. 5 to 7, two samples of organic light emitting display device containing the compounds of the Example 1 in the proportion of 19% and 25.5%, respectively, as dopants were prepared, and the data were obtained for them. FIG. 8 is the electroluminescence (EL) spectrum of compounds according to Comparative example 1 and 2 of the present invention, and FIG. 9 is a graph showing the electric current-voltage-luminance (I-V-L curve) of compounds according to Comparative example 1 and 2 of the present invention.

As shown in Table 1 and Figures, it can be found that, when a phosphorus atom which forms covalent bond with a transition metal atom is incorporated as an ancillary ligand, a dopant having excellent phosphorescent characteristic is formed, and it is suitable as a blue phosphorescent material. Further, it can be found that, by incorporating various main ligands, a full color of red, green and blue can be realized.

A cyclometalated transition metal complex according to the present invention can emit light at a wavelength range from blue to red region more efficiently by triplet metal-to-ligand charge-transfer (MLCT) by incorporating a phosphorus atom ligand that forms a covalent bond between a phosphorus atom and a transition metal atom. This organic metal complex can be used in forming an organic film of an organic electroluminescent display device. Such a cyclcometalated transition metal complex can emit light at the wavelength range of 400 nm to 650 nm with high efficiency. Further, the complex can emit white light with the use of a green light emitting material or a red light emitting material.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A cyclometalated transition metal complex represented by Formula I:

$$\{[C\char`\^N]_m M[P(R^1R^2)][LR^3R^4]_n\}_z \qquad (I)$$

wherein
M is a transition metal of Ru, Rh, Ir, Os, Pt or Au;
C^N is a cyclometalated ligand;
m is 1 or 2;
L is $PR^5$, $NR^5$, $AsR^5$, O, S, Se, or Te,
$R^1$ and $R^2$ are each independently an alkyl group, an aryl group, a heteroaryl group, an amino group, an alkoxy group, an aryloxy group, a heteroaryl group, or an oxyamino group;
$R^3$, $R^4$, and $R^5$ are each independently a hydrogen atom, an alkyl group, an alkynyl group, an aryl group, an amino group, an alkoxy group, an aryloxy group, an acyl group, an alkoxycarbonyl group, an acyloxy group, an acylamino group, an alkoxycarbonylamino group, an aryloxycarbonylamino group, a sulfonylamino group, a sulfamoyl group, a carbamoyl group, an arylthio group, a heteroarylthio group, a sulfonyl group, a sulfinyl group, an ureido group, a phosphoramide group, a hydroxy group, a mercapto group, a halogen atom, a cyano group, a sulfo group, a carboxy group, a nitro group, a hydroxamic group, a heterocyclic group, a silyl group, or a phosphino group;
P is a phosphonis atom;
n is 0 or 1, and m+n=2; and
z is 1 or 2.

2. The cyclometalated transition metal complex according to claim 1, wherein m is 2, and the two cyclometalated ligands C^N are the same.

3. The cyclometalated transition metal complex according to claim 1, the cyclometalated ligand is any one selected from the group consisting of the compounds below:

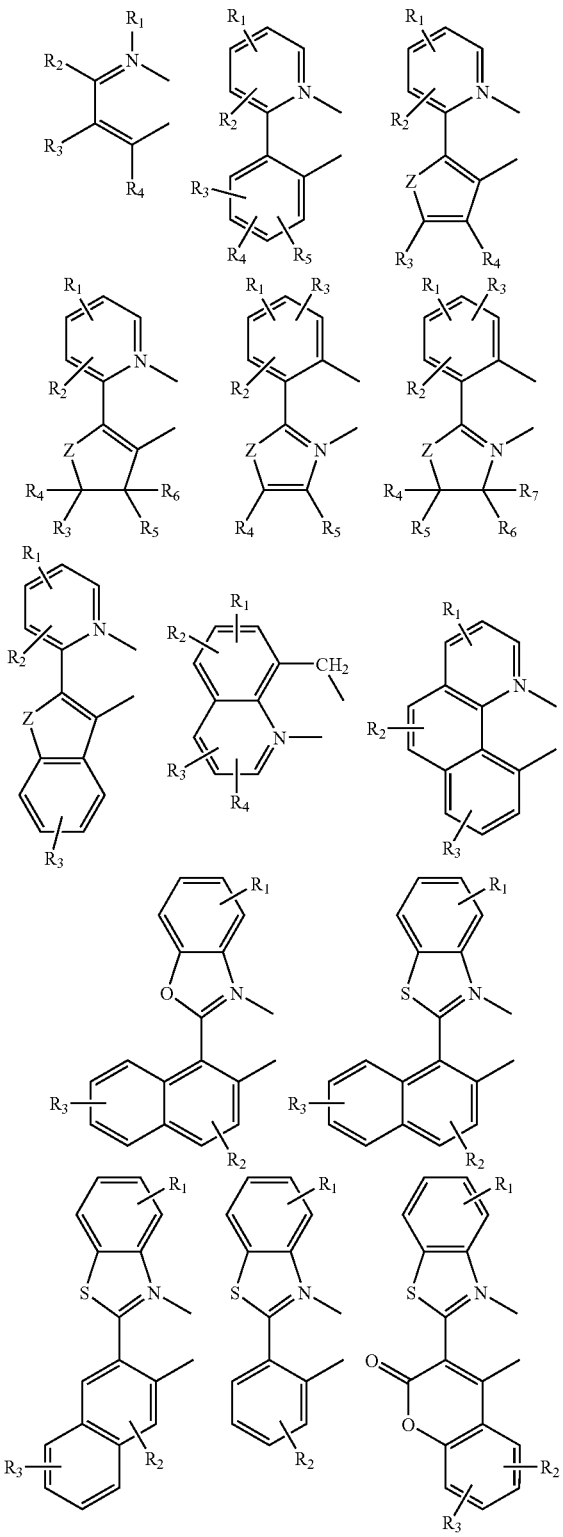

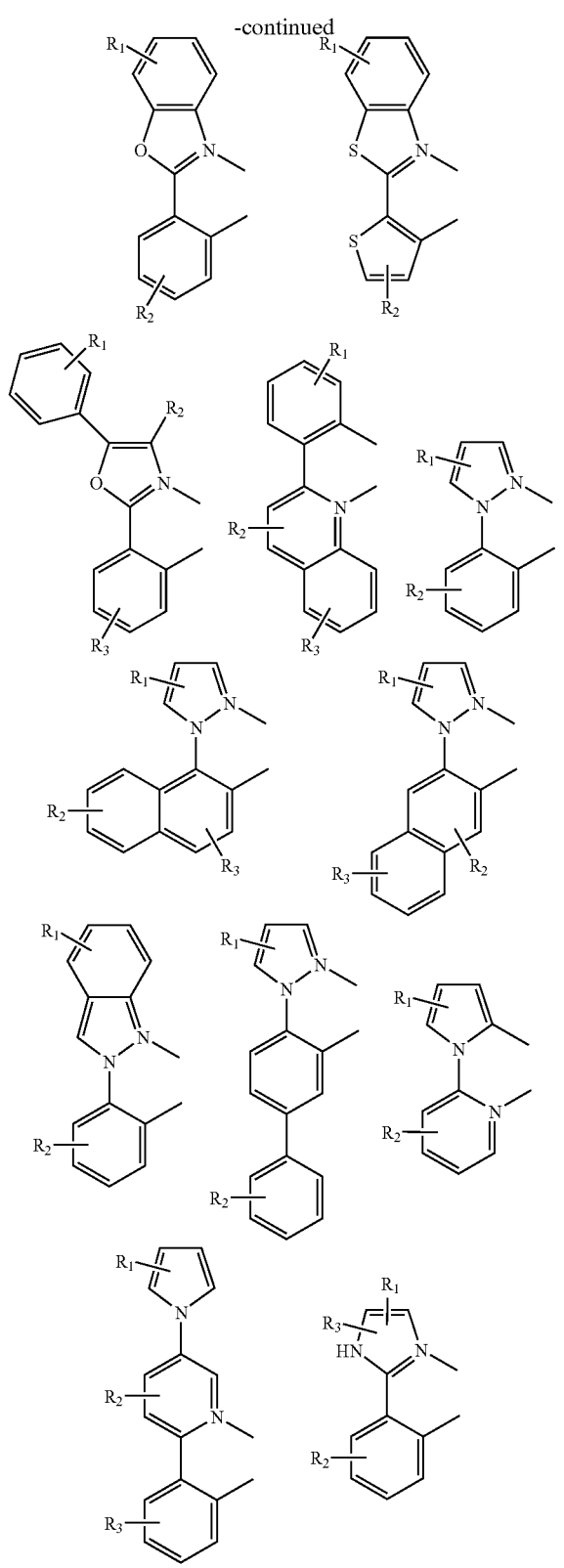

wherein Z is S, O or NR$_1$;

R$_1$, R$_2$, R$_3$, R$_4$, R$_5$ and R$_6$ may be each independently any one selected from the group consisting of a hydrogen atom, a halogen atom, CN, a silyl group, an alkyl group, an aryl group, an arylene group, an amino group, an alkoxy group, an aryloxy group, a heterocyclicoxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthia group, a heterocyclicthio group, a sulfonyl group, a sulfinyl group, an ureido group, a phosphoramide group, a sulfino group, a hydrazino group, an imino group, a heterocyclic group, a silyloxy group, a hydroxaminic group, a hydroxyl group, a mercapto group, a sulfo group, a carboxyl group and a nitro group, and at least two of R$_1$, R$_2$, R$_3$, R$_4$, R$_5$ and R$_6$ may bound to each other.

4. The cyclometalated transition metal complex according to claim 1, wherein the M is Ir(III).

5. The cyclometalated transition metal complex according to claim 1, wherein the cyclometalated transition metal complex emits light at a wavelength range of 400 nm to 650 nm.

6. The cyclometalated transition metal complex according to claim 1, wherein the cyclometalated transition metal complex is any one of the compounds below:

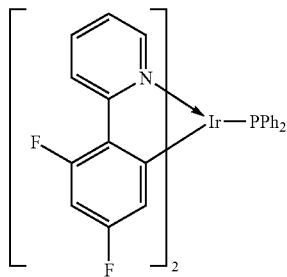

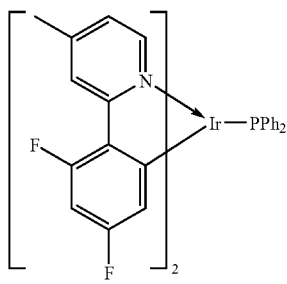

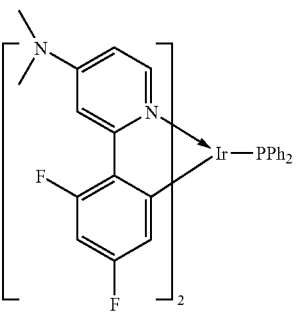

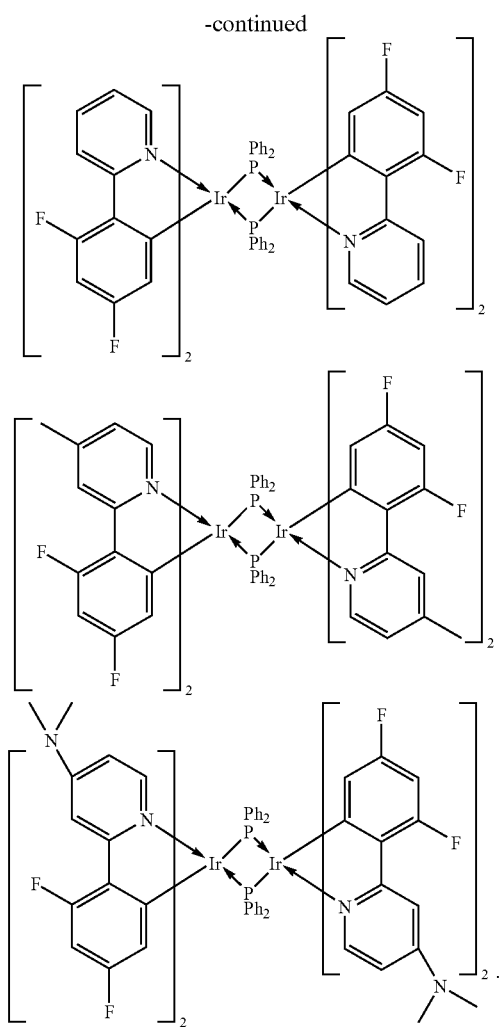

7. An organic electroluminescent display device comprising an organic film between a pair of electrodes, wherein the organic film comprises a cyclometalated transition metal complex according to claim 1.

8. The organic electroluminescent display device according to claim 7, wherein the organic film further comprises at least one selected from the group consisting of at least one of polymer hosts, a mixed host of a polymer and a small molecule host, a small molecule host, and a non-luminescent polymer matrix.

9. The organic electroluminescent display device according to claim 7, wherein the organic film further comprises a green light emitting material and a red light emitting material.

10. An organic electroluminescent display device, comprising:
   a pair of electrodes; and
   an organic film between the pair of electrodes, the organic film comprising at least one layer comprised of a cyclometalated transition metal complex having a transition metal and a phosphorus atom covalently bound to the transition metal, the cyclometalated transition metal complex represented by Formula I:

$$\{[C\hat{}N]_m M[P(R^1R^2)][LR^3R^4]_n\}_z \qquad (I)$$

wherein M is a transition metal of Ru, Rh, Ir, Os, Pt or Au;
C^N is a cyclometalated ligand is selected from the group consisting of the compounds below:

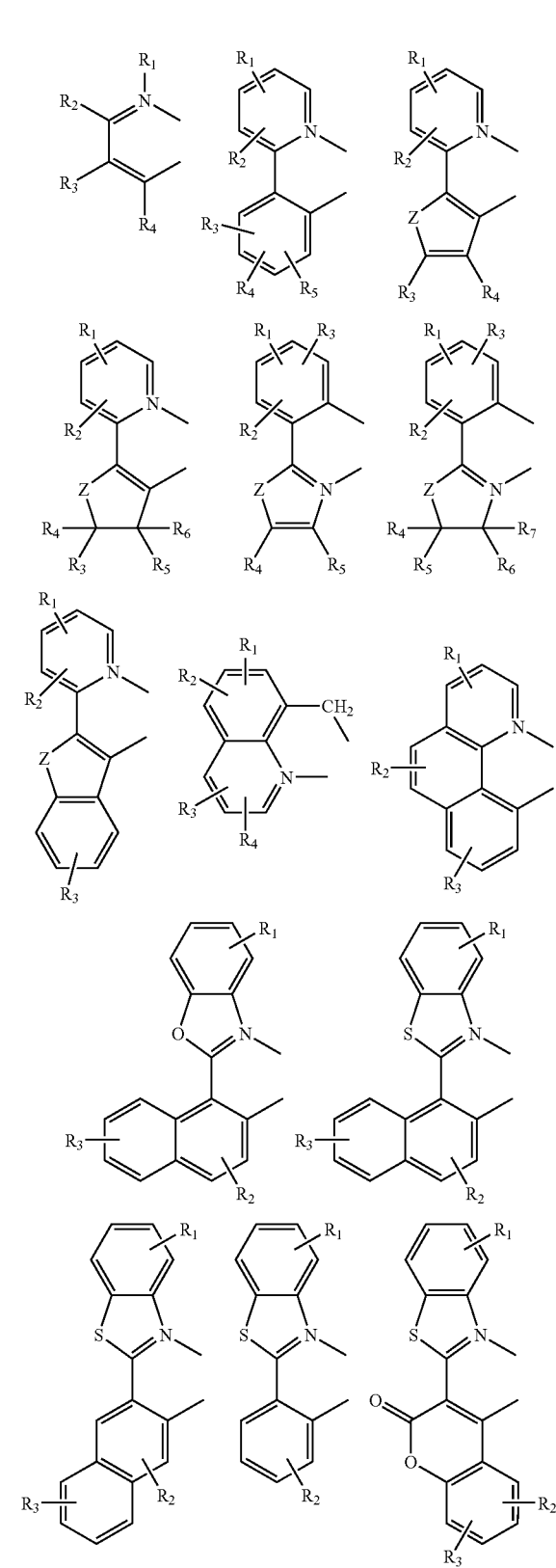

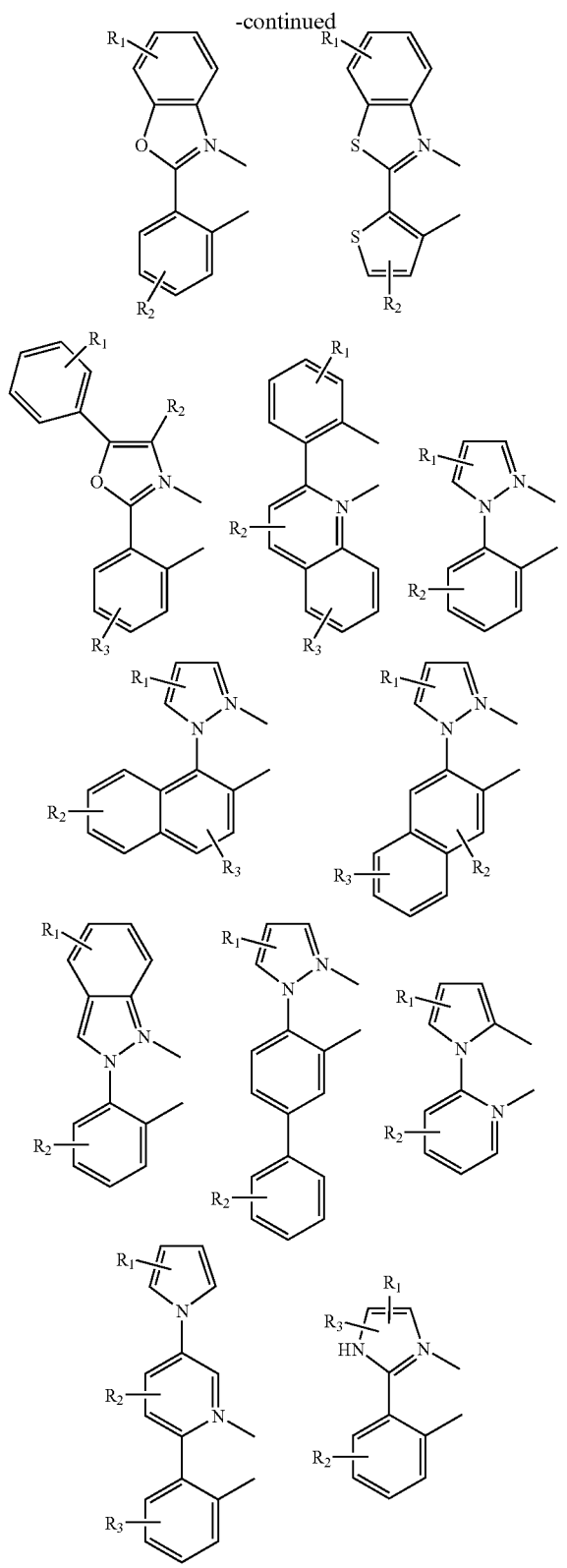

wherein Z is S, O or NR₁;

R₁, R₂, R₃, R₄, R₅ and R₆ may be each independently any one selected from the group consisting of a hydrogen atom, a halogen atom, CN, a silyl group, an alkyl group, an aryl group, an arylene group, an amino group, an alkoxy group, an aryloxy group, a heterocyclicoxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclicthio group, a sulfonyl group, a sulfinyl group, an ureido group, a phosphoramide group, a sulfino group, a hydrazino group, an imino group, a hecerocyclic group, a silyloxy group, a hydroxaminic group, a hydroxyl group, a mercapto group, a sulfo group, a carboxyl group and a nitro group, and at least two R₁, R₂, R₃, R₄, R₅ and R₆ may be bound to each other m is 1 or 2, and, when, when m is 2, the two cyclometalated ligands C^N are the same or different to each other;

L is PR⁵, NR⁵, AsR⁵ , O, S, Se, or Te;

and are each independently an alkyl group, an aryl group, a heteroaryl group, an amino group, an alkoxy group, an aryloxy group, a heteroaryl group, or an oxyamino group; R³, R⁴, and R⁵ are each independently a hydrogen atom, an alkyl group, an alkynyl group, an aryl group, an amino group, an alkoxy group, an aryloxy group, an acyl group, an alkoxycarbonyl group, an acyloxy group, an acylamino group, an alkoxycarbonylamino group, an aryloxycarbonylamino group, a sulfonylaniino group, a sulfamoyl group, a carbamoyl group, an arylthio group, a heteroaryithia group, a sulfonyl group, a sultinyl group, an ureido group, a phosphoramide group, a hydroxy group, a mercapto group, a halogen atom, a cyano group, a sulfa group, a carboxy group, a nitro group, a hydroxamic group, a heterocyclic group, a silyl group, or a phosphino group;

P is a phosphorus atom;

n is 0 or 1, and m+n=2; and

Z is 1 or 2.

11. An organic electroluminescent display device, comprising:

a pair of electrodes;

an organic film between the pair of electrodes, the organic film comprising a cyclometalated transition metal complex represented by Formula I:

$$\{[C^\wedge N]_m M[P(R^1R^2)][LR^3R^4]_n\}_z \quad (I)$$

wherein M is a transition metal of Ru, Rh, Ir, Os, Pt or Au;

C^N is a cyclometalated ligand;

m is 1 or 2;

L is PR⁵, NR⁵, AsR⁵, O , S, Se, or Te;

R¹ and R² are each independently an alkyl group, an aryl group, a heteroaryl group, an amino group, an alkoxy group, an aryloxy group, a heteroaryl group, or an oxyamino group;

R³, R⁴, and R⁵ are each independently a hydrogen atom, an alkyl group, an alkynyl group, an aryl group, an amino group, an alkoxy group, an aryloxy group, an acyl group, an alkoxycarbonyl group, an acyloxy group, an acylamino group, an alkoxycarbonylamino group, an aryloxycarbonylamino group, a sulfonylamino group. a sulfamoyl group, a carbamoyl group, an arylthio group, a heteroarylthio group, a sulfonyl group, a sulfinyl group, an ureido group, a phosphoramide group, a hydroxy group, a mercapto group, a halogen atom, a cyano group, a sulfo group, a carboxy group, a nitro group, a hydroxamic group, a heterocyclic group, a silyl group, or a phosphino group;

P is a phosphorus atom;

n is 0 or 1, and m+n=2; and z is 1 or 2.

12. The organic electroluminescent display device according to claim 11, wherein m is 2, and the two cyclometalated ligands C^N are the same.

13. The organic electroluminescent display device according to claim 12, wherein m is 2, n is 0, and the cyclometalated transition metal complex is in the form of a monomer or a dimer represented by Formula II:

$$\left[\left(\begin{array}{c}C\\N\end{array}\right)_2 M \begin{array}{c}R_1R_2\\P\\P\\R_1R_2\end{array} M \left(\begin{array}{c}C\\N\end{array}\right)_2\right]_2.$$
(II)

14. The organic electroluminescent display device according to claim 11, wherein the cyclometalated ligand is any one selected from the group consisting of the compounds below:

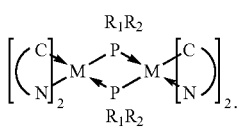

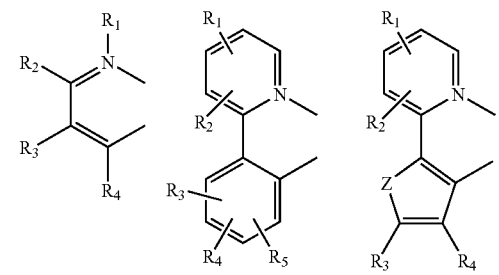

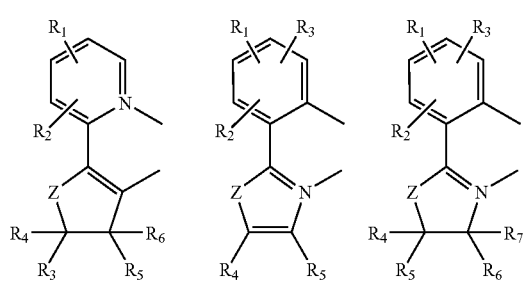

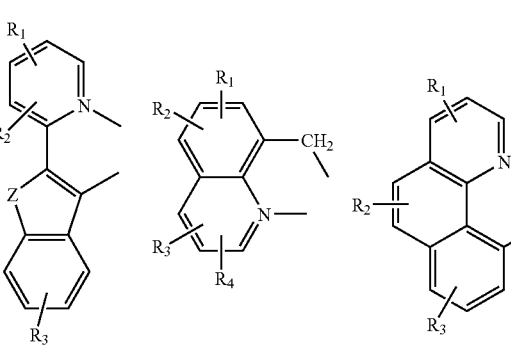

-continued

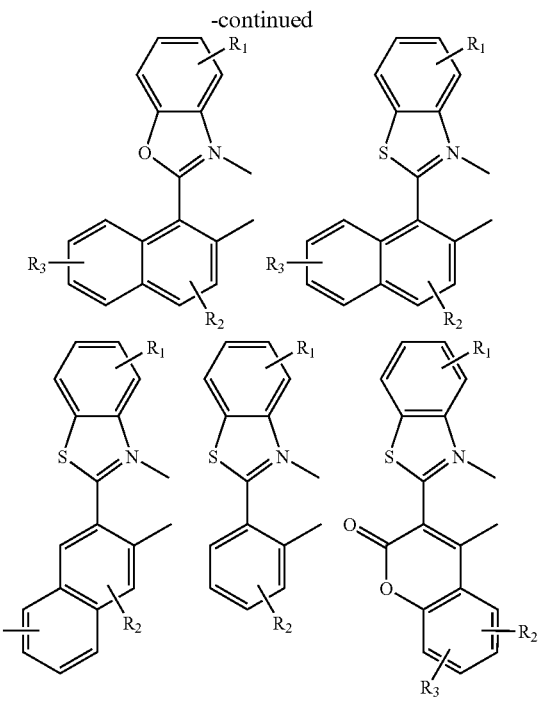

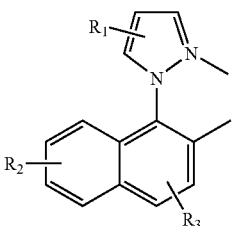
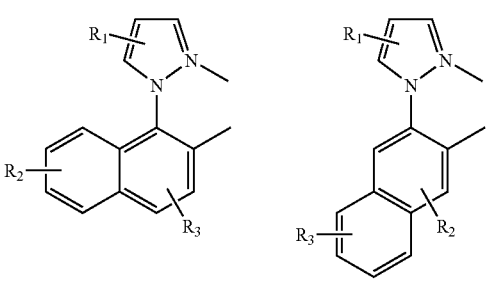

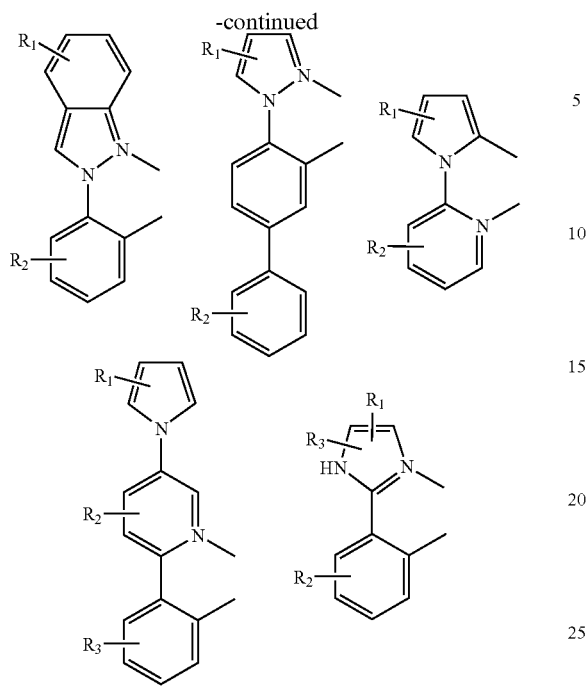

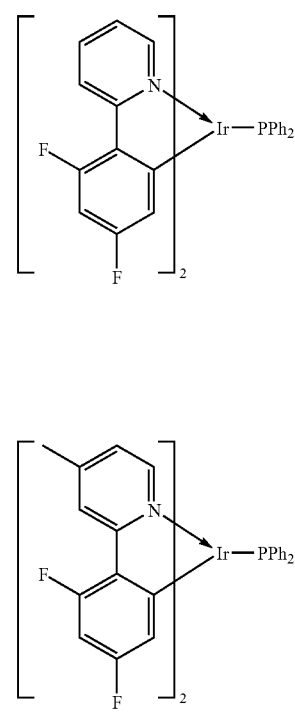

wherein Z is S, O or NR$_1$;

R$_1$, R$_2$, R$_3$, R$_4$, R$_5$ and R$_6$ may be each independently any one selected from the group consisting of a hydrogen atom, a halogen atom, CN, a silyl group, an alkyl group, an aryl group, an arylene group, an amino group, an alkoxy group, an aryloxy group, a heterocyclicoxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclicthio group, a sulfonyl group, a sulfinyl group, an ureido group, a phosphoramide group, a sulfino group, a hydrazino group, an imino group, a heterocyclic group, a silyloxy group, a hydroxyaminic group, a hydroxyl group, a mercapto group, a sulfo group, a carboxyl group and a nitro group, and at least two R$_1$, R$_2$, R$_3$, R$_4$, R$_5$ and R$_6$ may be bound to each other.

15. The organic electroluminescent display device according to claim 11, wherein the cyclometalated transition metal complex emits light at a wavelength range of 400 nm to 650 nm.

16. The organic electroluminescent display device according to claim 11, wherein the organic film further comprises at least one selected from the group consisting of at least one of polymer hosts, a mixed host of a polymer and a small molecule host, a small molecule host, and a non-luminescent polymer matrix.

17. The organic electroluminescent display device according to claim 11, wherein the organic film further comprises a green light emitting material and a red light emitting material.

18. The organic electroluminescent display device according to claim 11, wherein the cyclometalated transition metal complex is any one of the compounds below:

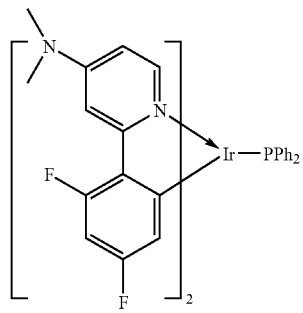

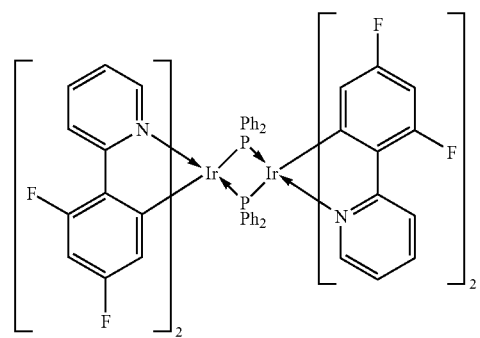

-continued
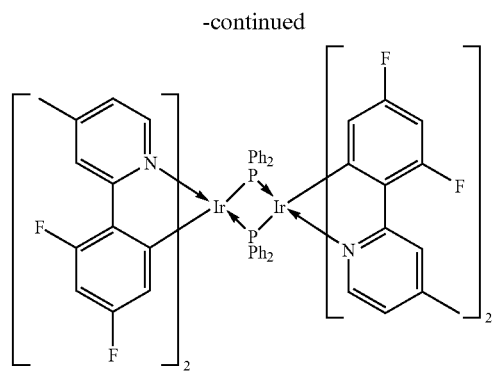
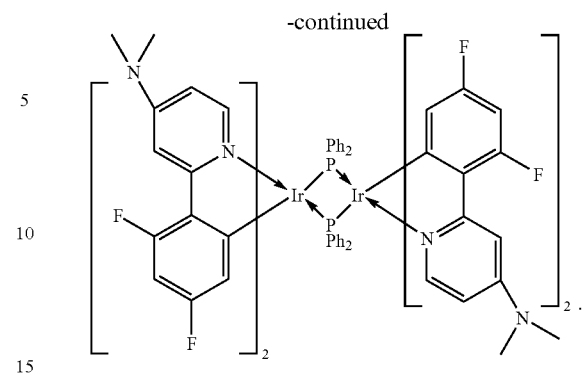
* * * * *